United States Patent
Basker et al.

(10) Patent No.: US 9,455,323 B2
(45) Date of Patent: Sep. 27, 2016

(54) UNDER-SPACER DOPING IN FIN-BASED SEMICONDUCTOR DEVICES

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Mountain View, CA (US); Charles W. Koburger, III, Delmar, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/471,573

(22) Filed: Aug. 28, 2014

(65) Prior Publication Data

US 2016/0064527 A1    Mar. 3, 2016

(51) Int. Cl.
| | |
|---|---|
| *H01L 21/76* | (2006.01) |
| *H01L 29/423* | (2006.01) |
| *H01L 29/78* | (2006.01) |
| *H01L 29/161* | (2006.01) |
| *H01L 29/167* | (2006.01) |
| *H01L 29/08* | (2006.01) |
| *H01L 29/66* | (2006.01) |

(52) U.S. Cl.
CPC ..... *H01L 29/42356* (2013.01); *H01L 29/0847* (2013.01); *H01L 29/161* (2013.01); *H01L 29/167* (2013.01); *H01L 29/66545* (2013.01); *H01L 29/66795* (2013.01); *H01L 29/785* (2013.01)

(58) Field of Classification Search
CPC ................ H01L 2924/0002; H01L 29/66628; H01L 21/823807; H01L 21/823814; H01L 2924/00; H01L 29/665; H01L 29/66545; H01L 29/66795; H01L 29/785; H01L 21/28518; H01L 21/2855; H01L 21/76843; H01L 21/76
See application file for complete search history.

(56) References Cited

U.S. PATENT DOCUMENTS

| | | | |
|---|---|---|---|
| 7,018,901 B1 | 3/2006 | Thean et al. | |
| 7,037,818 B2 | 5/2006 | Dokumaci et al. | |
| 7,456,471 B2 | 11/2008 | Anderson et al. | |
| 7,736,957 B2 | 6/2010 | Grudowski et al. | |
| 8,263,451 B2 | 9/2012 | Su et al. | |
| 8,435,846 B2 | 5/2013 | Cheng et al. | |
| 2008/0157208 A1* | 7/2008 | Fischer | H01L 21/76843 257/368 |
| 2012/0061759 A1 | 3/2012 | Cheng et al. | |
| 2012/0217553 A1 | 8/2012 | Luo et al. | |
| 2012/0313170 A1 | 12/2012 | Chang et al. | |

(Continued)

OTHER PUBLICATIONS

List of IBM Patents or Patent Applications Treated as Related; (Appendix P), Filed Oct. 9, 2015; 2 pages.
Veeraraghavan S. Basker et al., "Under-Spacer Doping in Fin-Based Semiconductor Devices", U.S. Appl. No. 14/879,159, filed Oct. 9, 2015.

(Continued)

*Primary Examiner* — Robert Bachner
(74) *Attorney, Agent, or Firm* — Cantor Colburn LLP; Vazken Alexanian

(57) ABSTRACT

A fin field effect transistor (FinFET) device and a method of fabricating the FinFET are described. The device includes a fin formed on a substrate, the fin including a channel region of the device and a spacer and a cap formed over a dummy gate line separating a source and drain of the device. The device also includes an epitaxial layer formed over portions of the fin, the epitaxial layer being included between the fin and the spacer.

7 Claims, 15 Drawing Sheets

(56) References Cited

U.S. PATENT DOCUMENTS

2013/0187228 A1* 7/2013 Xie ............... H01L 29/785
  257/347
2013/0330915 A1* 12/2013 Hu ............... H01L 21/02381
  438/492

OTHER PUBLICATIONS

Tan et al., "Strained p-Channel FinFETs With Extended Π-Shaped Silicon—Germanium Source and Drain Stressors", IEEE Electronics Device Letters, vol. 28, No. 10, Oct. 2007, pp. 905-908.

* cited by examiner

UNDER-SPACER DOPING IN FIN-BASED SEMICONDUCTOR DEVICES

BACKGROUND

The present invention relates to fin-based semiconductor devices, and more specifically, to decoupling extension resistance and parasitic capacitance.

Fin-based semiconductor devices require raised source/drain structures that are fabricated using an epitaxial silicon layer (epi/raised S/D). The epi/raised S/D has a drawback of increased parasitic capacitance between the epitaxial layer and the gate. Also, in some fin-based devices, the extension resistance becomes the dominant component of total resistance. This extension resistance can be lowered by thickening the epitaxial layer. However, a thicker epitaxial layer has a consequence of a larger capacitor area (increased capacitance).

SUMMARY

According to one embodiment of the present invention, a fin field effect transistor (FinFET) device includes a fin formed on a substrate, the fin including a channel region of the device; a spacer and a cap formed over a dummy gate line separating a source and drain of the device; and an epitaxial layer formed over portions of the fin, the epitaxial layer being included between the fin and the spacer.

According to another embodiment of the present invention, a method of fabricating a fin field effect transistor (FinFET) device includes forming a fin on a substrate, the fin including a channel region of the device; forming a spacer and a cap over a dummy gate line separating a source and drain of the device; and growing an epitaxial layer over portions of the fin including a region between the fin and the spacer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, epitaxial raised source/drain (epi/raised S/D) regions present a tradeoff challenge because lowering extension resistance by using a thicker epitaxial layer has the unwanted consequence of increasing parasitic capacitance. Embodiments of the system and method detailed herein relate to decoupling extension resistance and capacitance so that extension resistance may be lowered without a parasitic capacitance penalty. While the details below relate to an exemplary silicon on insulator (SOI) fin, the descriptions below also pertain to bulk fins, as well. In addition, while embodiments of the invention are described in the context of a finFET, the embodiments detailed below also apply to other device structures such as nanowires, for example.

Figure 1:
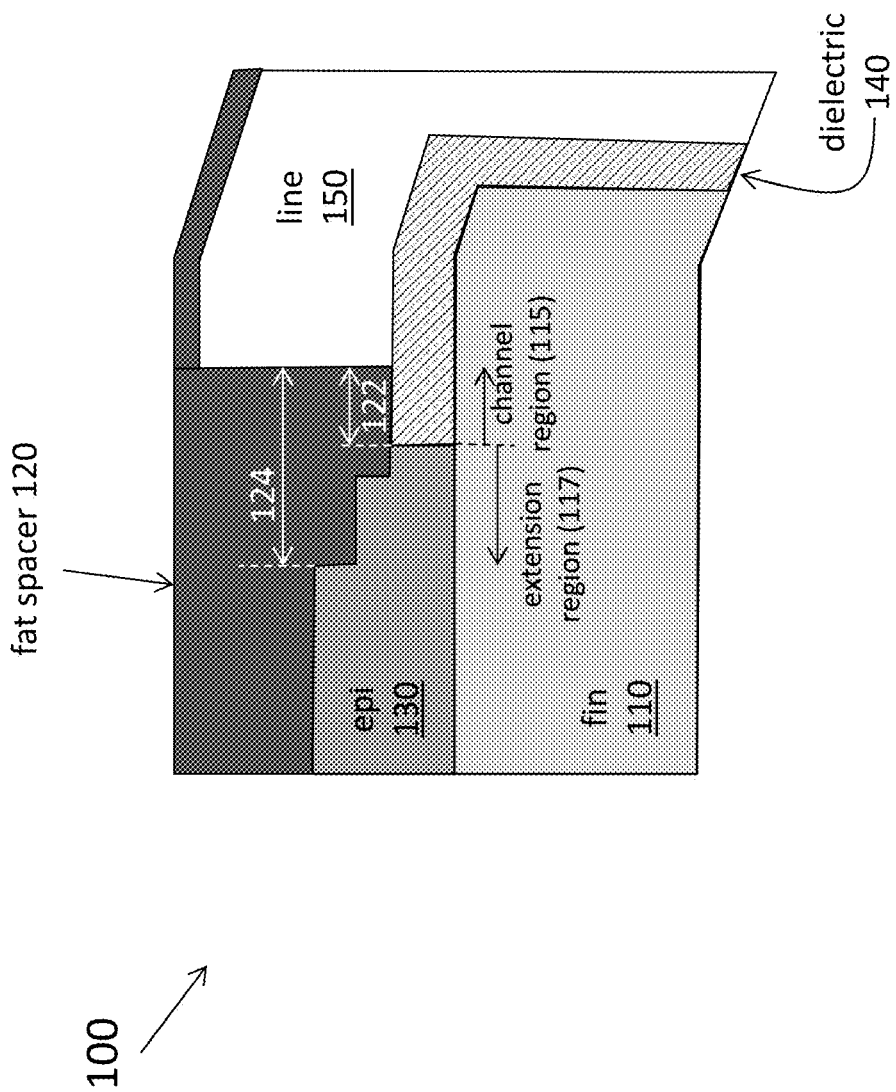
FIG. 1 depicts aspects of a field effect transistor device with an epitaxial layer formed according to an embodiment of the invention.

FIG. 1 depicts aspects of a field effect transistor device 100 with an epitaxial layer 130 formed according to an embodiment of the invention. The device 100 is, for example, a fin-based metal-oxide-semiconductor field-effect transistor (MOSFET) in which one or more fins 110 include a channel between a source and drain. Only a source or drain is depicted in FIG. 1. As FIG. 1 illustrates, a portion of the fin 110 that has the fat spacer 120 above it is separated from the fat spacer 120 by the epitaxial layer 130. The epitaxial layer 130 may be comprised of silicon germanium (SiGe) doped with boron, for example. The inclusion of the epitaxial layer 130, configured in a step pattern as shown, under the fat spacer 120 facilitates a decoupling of the extension resistance and the parasitic capacitance. That is, extension resistance may be lowered without a penalty of increased parasitic capacitance. As FIG. 1 shows, the epitaxial layer 130 is thicker in the extension region 117 than it is at the border of the channel region 115. The extension resistance is determined based on the dimension 122, while the parasitic capacitance is determined based on the dimension 124. As a result of the dimension 124 being greater than the dimension 122, both parasitic capacitance and extension resistance may be kept low.

Figure 2:
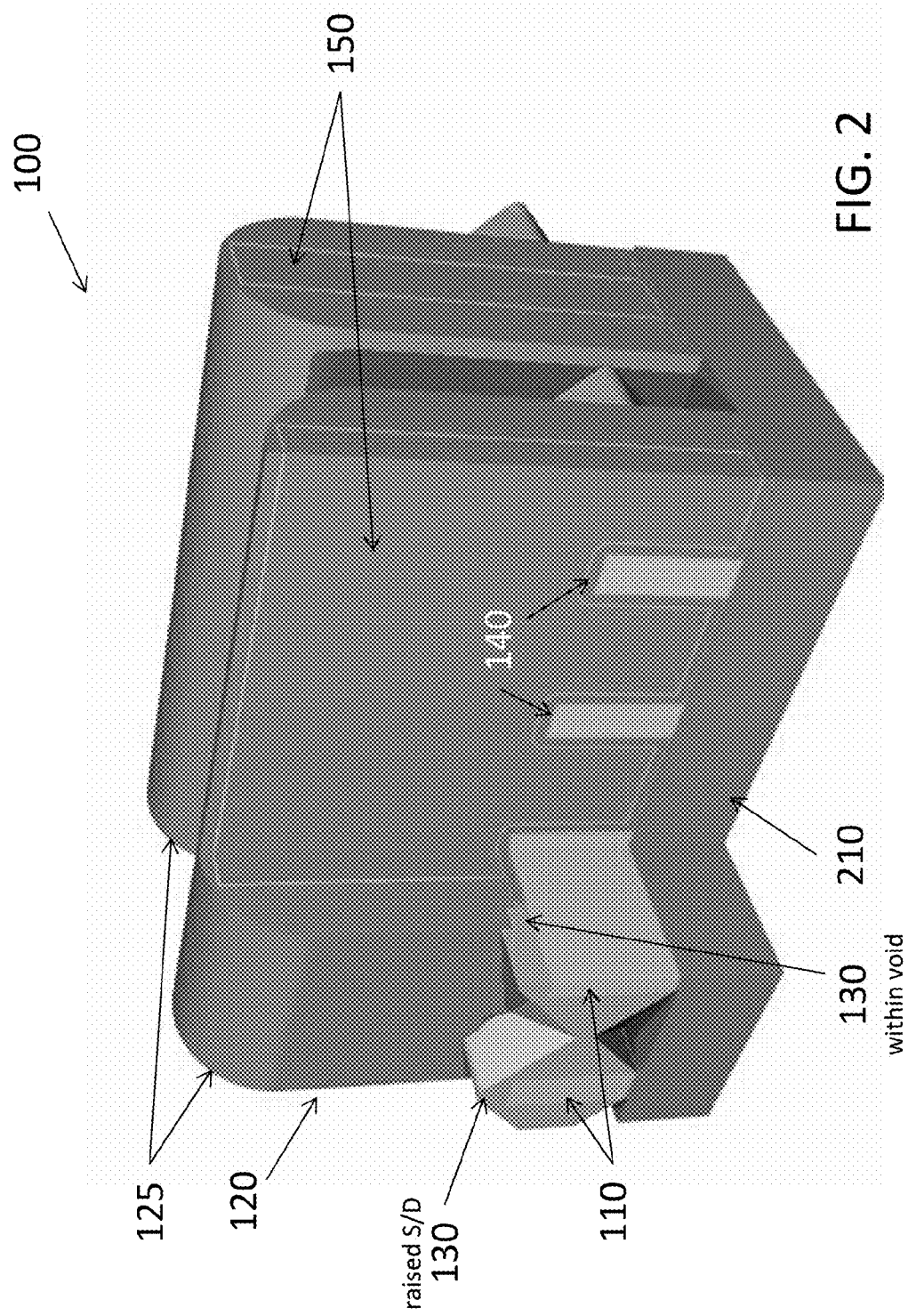
FIG. 2 shows additional aspects of the device shown in FIG. 1.

FIG. 2 shows additional aspects of the device 100 shown in FIG. 1. As FIG. 2 shows, fins 110 are formed on a substrate formed of, for example, a buried oxide (BOX) 210 layer. The extension region 117 of the fin 110 (FIG. 1) extends to a raised source/drain. The dummy gate lines 150 are covered by the fat spacer 120 and a cap 125. The epitaxial layer 130 is shown in a diamond shape around the fins 110 (in the raised source/drain region) in FIG. 2. However, embodiments of the invention do not limit the epitaxial layer 130 to any particular shape. As noted with respect to FIG. 1, the epitaxial layer 130 extends under the fat spacer 120 ("within void").

Figure 3:
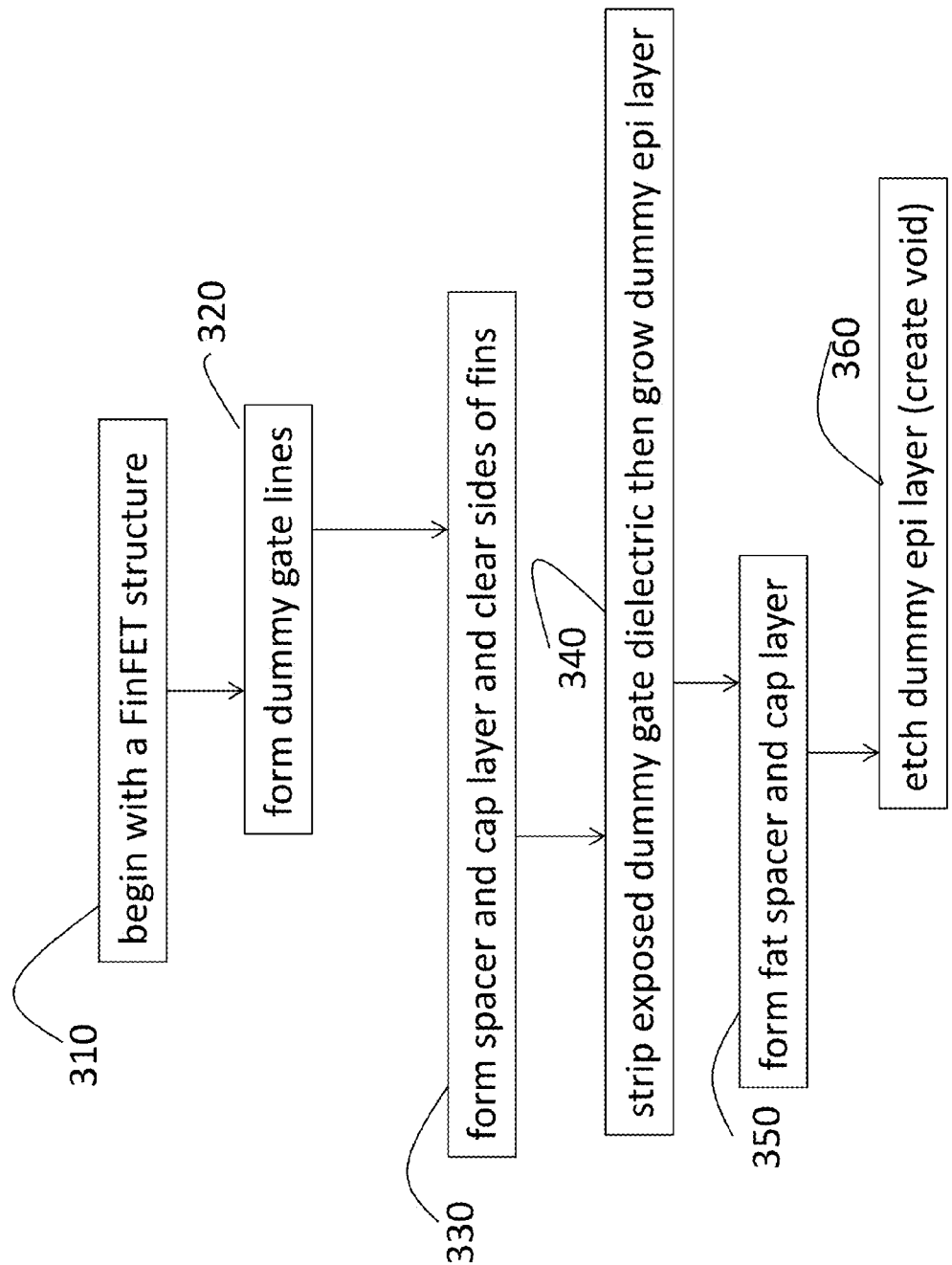
FIG. 3 is a process flow of a method of forming a void for growth of the epitaxial layer between the fin and the fat spacer and cap according to one embodiment of the invention.
Figure 4:
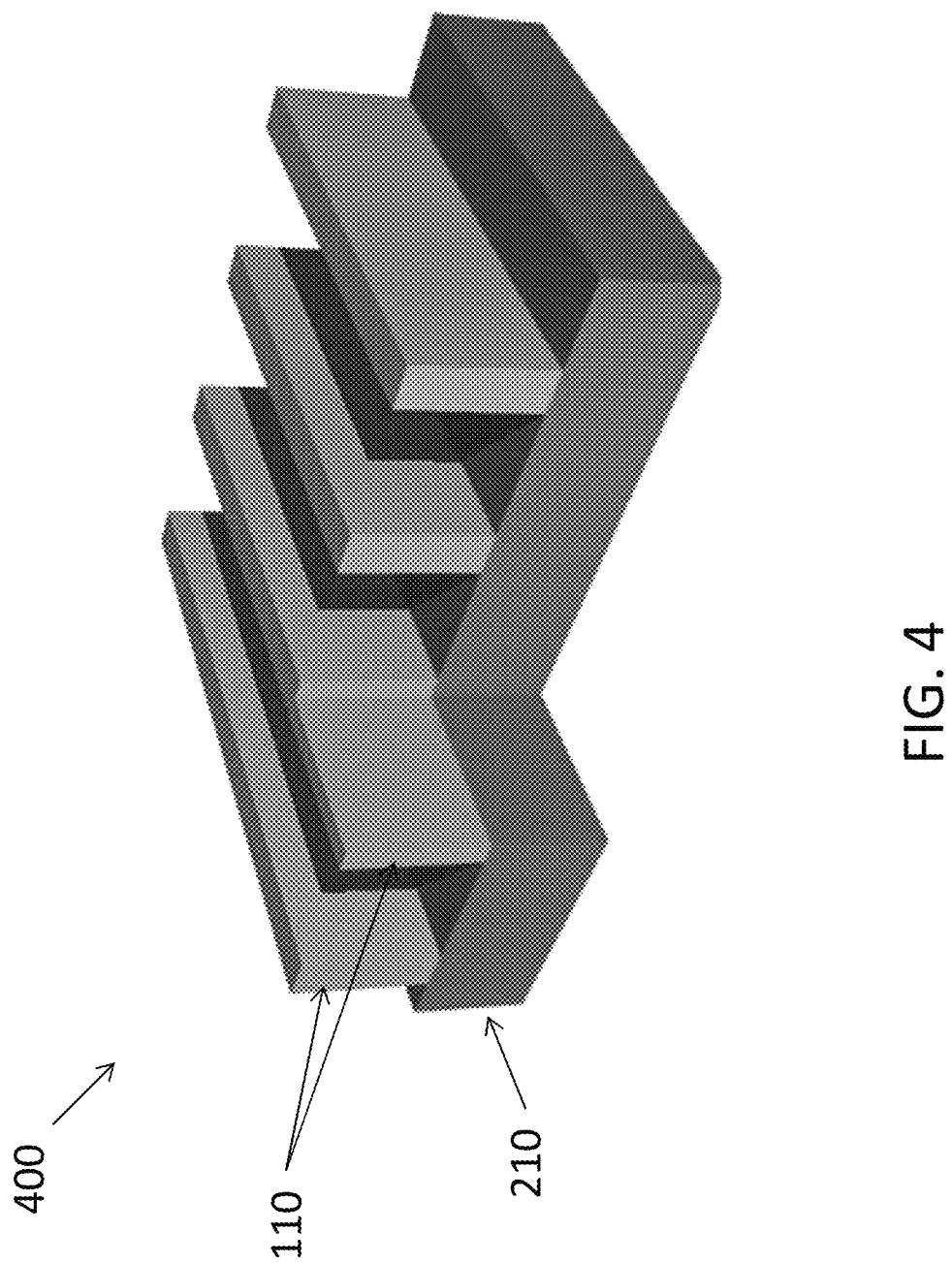
FIG. 4 illustrates the fin structure used to form the device according to embodiments of the invention.
Figure 5:
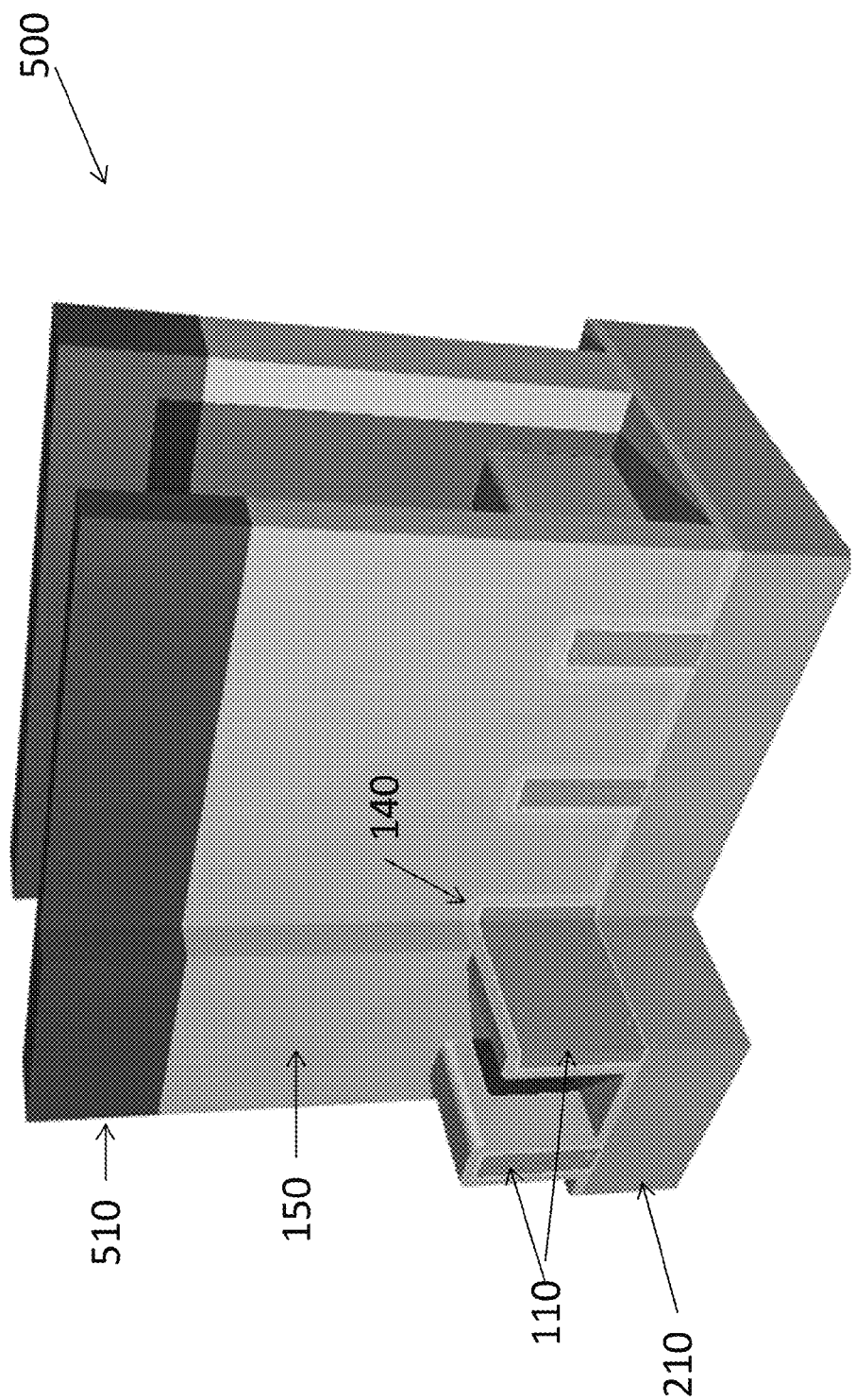
FIG. 5 illustrates the structure resulting from forming the capped dummy gate lines.

FIG. 3 is a process flow of a method of forming a void for growth of the epitaxial layer 130 between the fin 110 and the fat spacer 120 according to one embodiment of the invention. At block 310, the process includes beginning with a fin structure 400 (FIG. 4). FIG. 4 illustrates the fin structure 400 used to form the device 100 (FIGS. 1 and 2) according to embodiments of the invention. The fin structure 400 includes the BOX 210 with patterned silicon fins 110. At block 320, the process includes forming the dummy gate lines 150. FIG. 5 illustrates the structure 500 resulting from forming the capped dummy gate lines 150. The process at block 320 includes depositing a dummy gate dielectric 140, depositing a dummy gate electrode layer, planarizing the dummy gate electrode layer, then depositing a cap layer 510 and patterning the cap layer 510 and dummy gate electrode layer to form the dummy gate lines 150. The dummy gate dielectric 140 may be formed by depositing 30 nanometers (nm) of silicon dioxide ($SiO_2$), for example. The dummy gate electrode layer that is planarized and patterned to form the dummy gate lines 150 may be an amorphous silicon layer, and the cap layer 510 may be formed from silicon nitride ($Si_3N_4$). When the cap layer 510 and the dummy gate electrode layer are patterned to form the dummy gate lines 150, the dummy gate lines 150 have self-aligned caps 510, as shown in FIG. 5.

Figure 6:
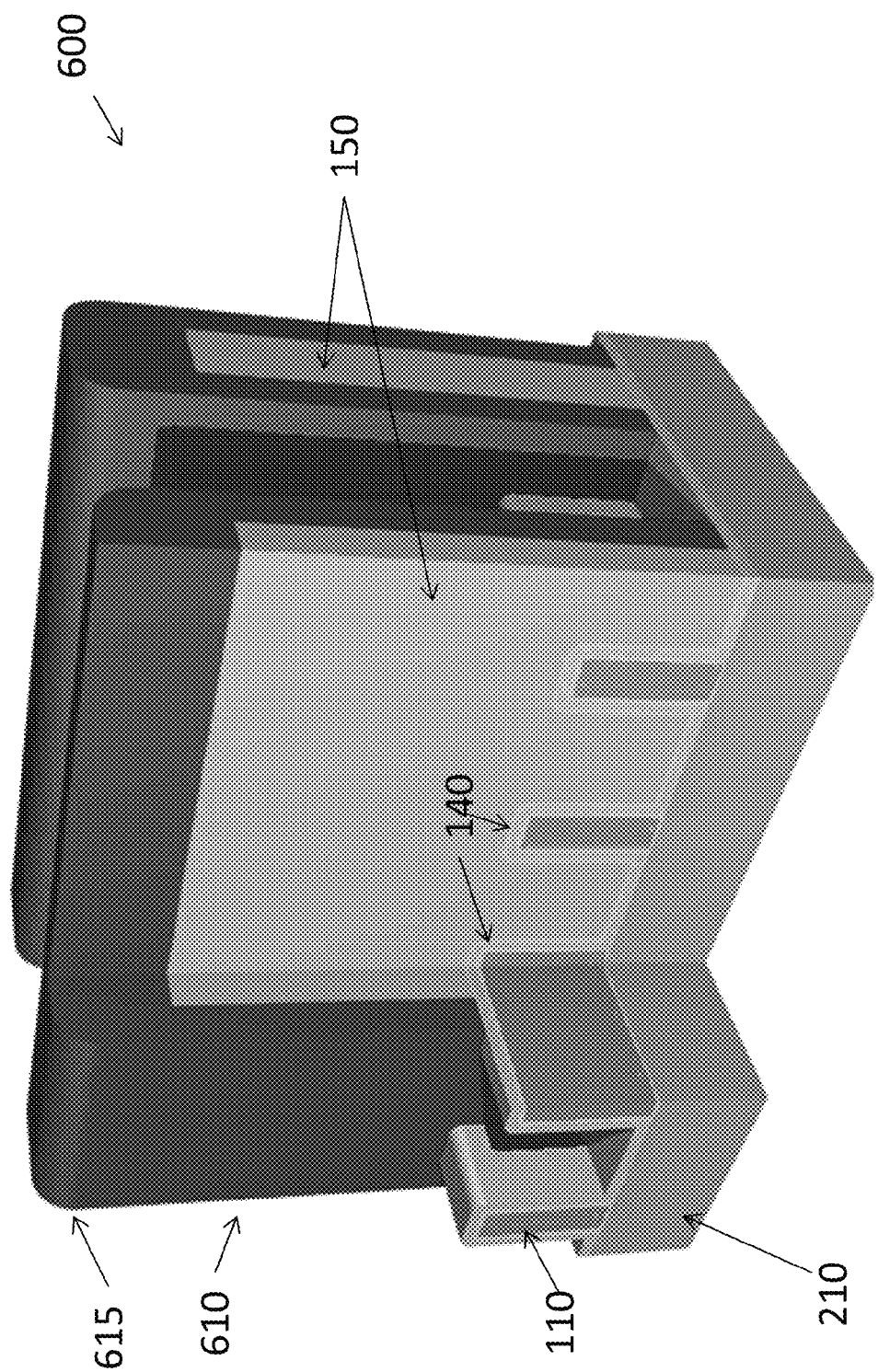
FIG. 6 shows a structure that results from forming the spacer and cap layer.
Figure 7:
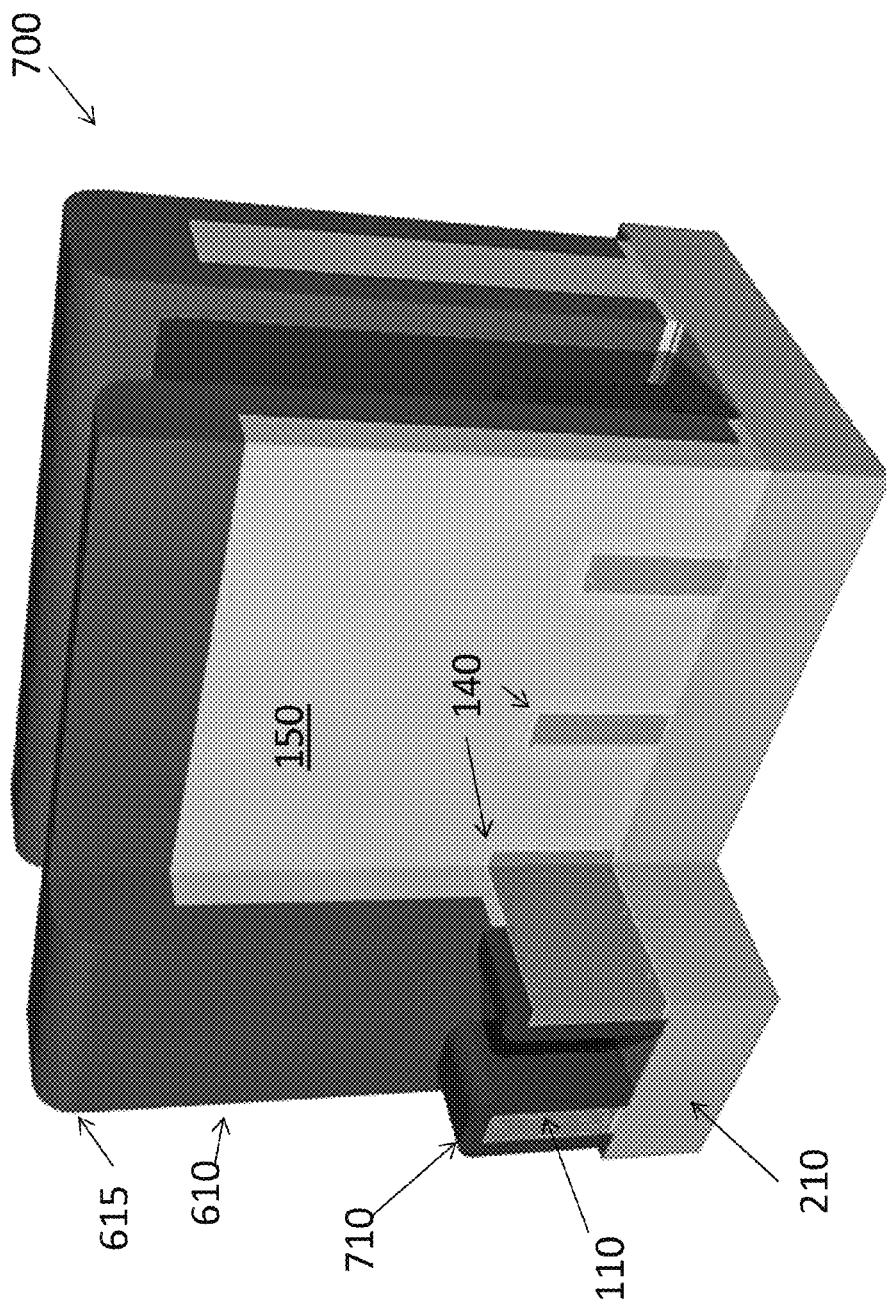
FIG. 7 shows the structure resulting from growing the dummy epitaxial layer.
Figure 8:
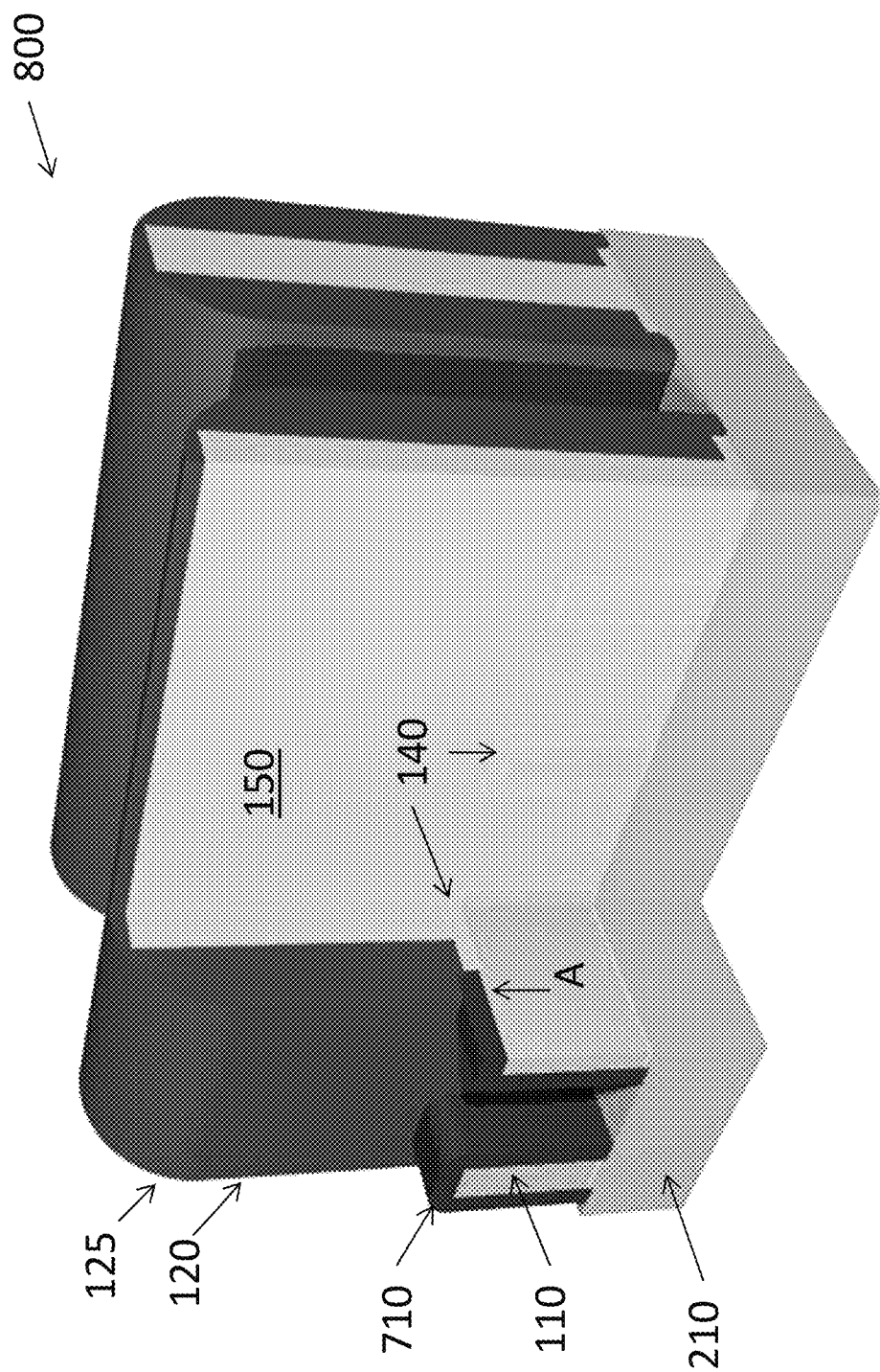
FIG. 8 illustrates the structure that includes the fat spacer and cap.
Figure 9:
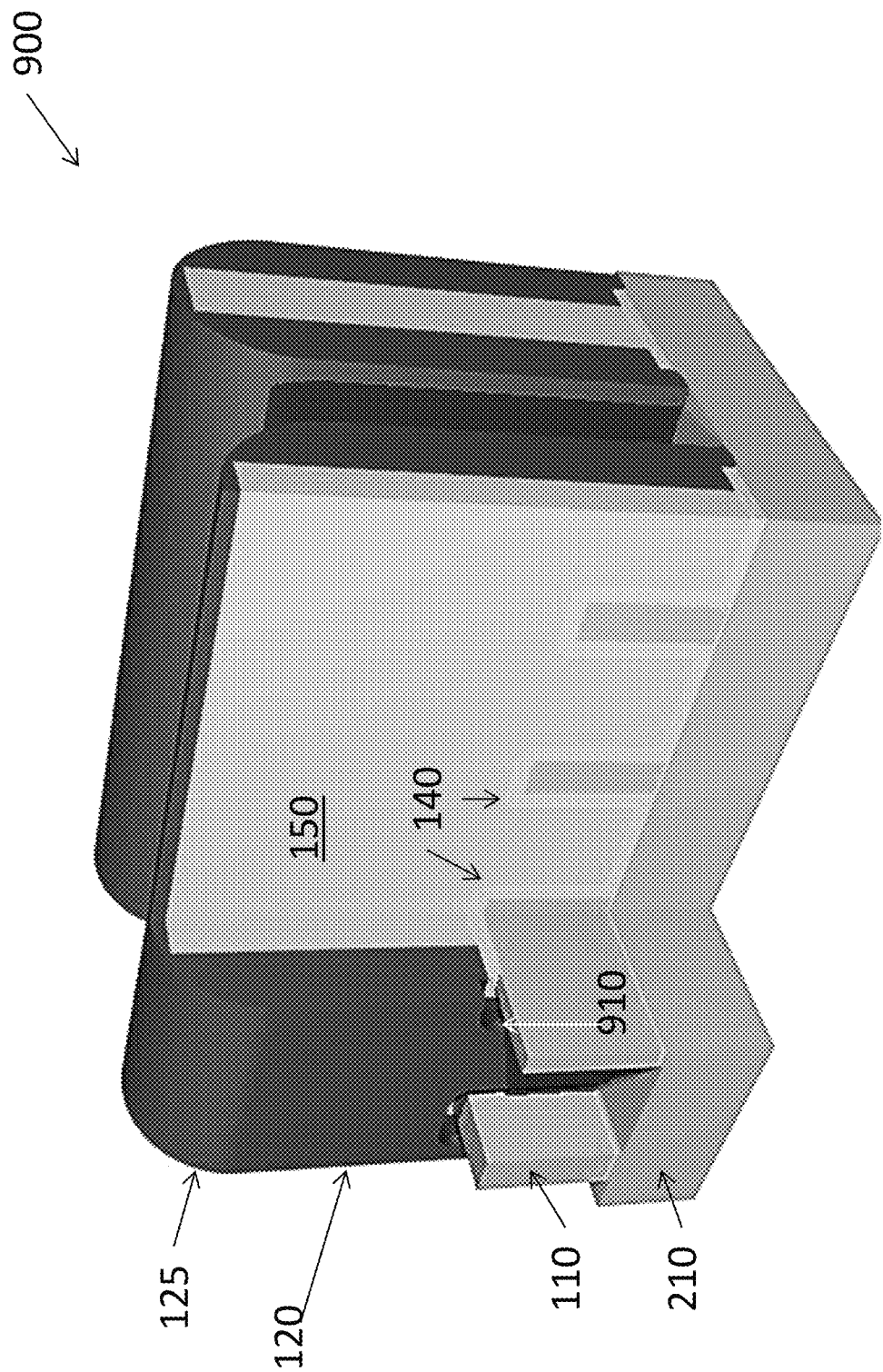
FIG. 9 depicts the structure including the void resulting from the embodiment described by the method shown in FIG. 3.

At block 330, the process shown in FIG. 3 includes forming a spacer 610 and cap 615 layer (FIG. 6) and clearing the sides of the fins 110. FIG. 6 shows a structure 600 that results from forming the spacer 610 and cap 615 layer. The spacer 610 and cap 615 may be formed by depositing conformal a nitride (e.g., $Si_3N_4$) and performing a reactive-ion etch (RIE). The RIE process may be extended to clear the sides of the fins 110, but, as shown in FIG. 6, the fins 110 are still coated with the dummy gate dielectric 140. At block 340, the process shown in FIG. 3 includes stripping exposed dummy gate dielectric 140 and then growing a dummy epitaxial layer 710 (FIG. 7). FIG. 7 shows the structure 700 resulting from growing the dummy epitaxial layer 710. The dummy epitaxial layer 710 may be a thin undoped high-germanium layer. The dummy epitaxial layer 710 may be comprised of any material that can be etched selectively with respect to the fin 110 material, the dummy gate dielectric 140, the spacer 610, and the cap 615. At block 350 of the method shown in FIG. 3, forming the fat spacer 120 and cap 125 layer may include depositing an additional conformal nitride ($Si_3N_4$) layer to fatten the spacer 610 and cap 615 (FIGS. 6 and 7) and performing RIE. FIG. 8 illustrates the structure 800 that includes the fat spacer 120 and cap 125. At this stage, the dummy epitaxial layer 710 is between the fat spacer 120 and the fin 110 (labeled "A"). At block 360 of the method shown in FIG. 3, etching the dummy epitaxial layer 710 creates the void 910 in which the epitaxial layer 130 may be grown between the fat spacer 120 and the fin 110 (as shown in FIGS. 1 and 2, for example). FIG. 9 depicts the structure 900 including the void 910 resulting from the embodiment described by the method shown in FIG. 3 at block 360.

Figure 10:
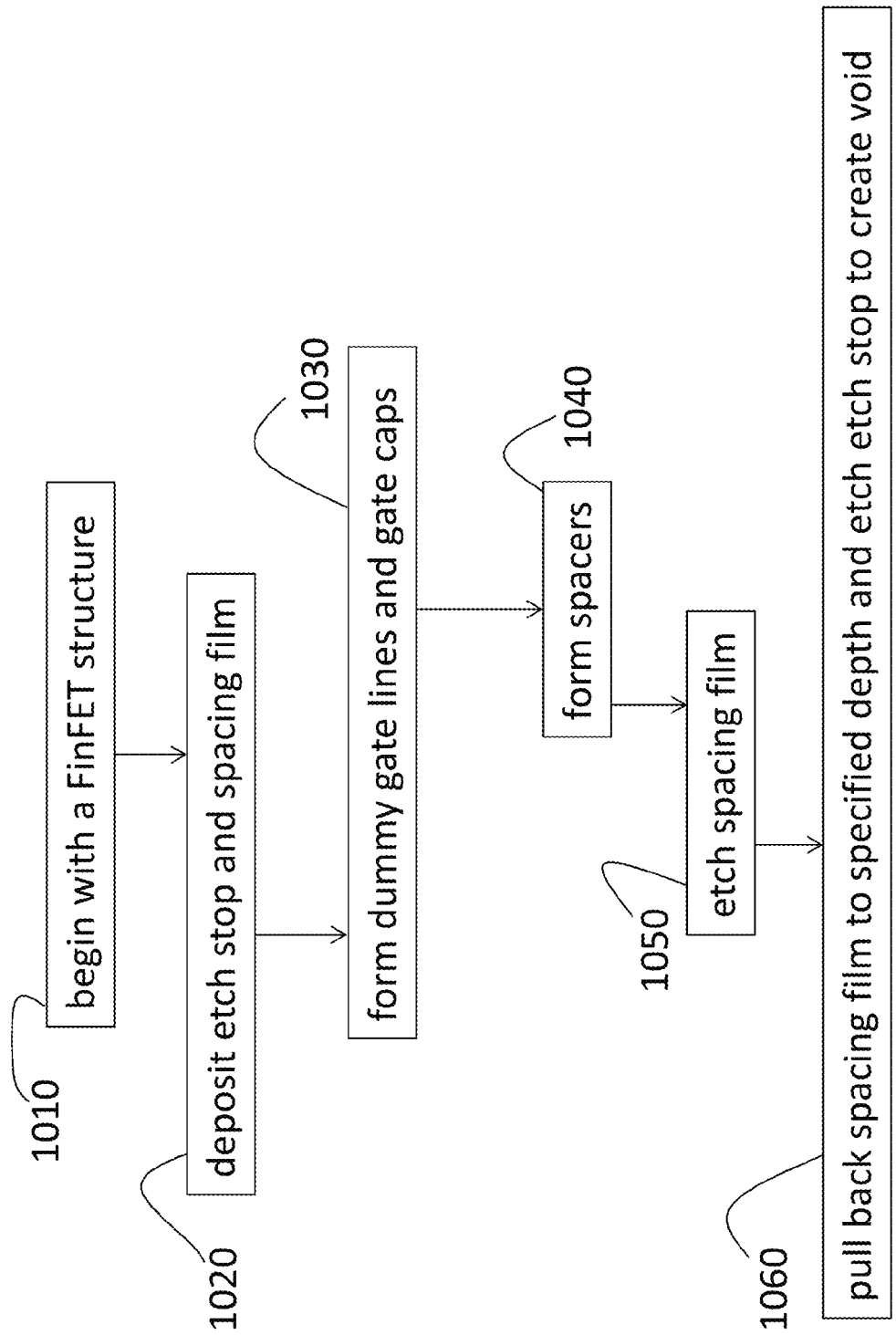
FIG. 10 is a process flow of a method of forming a void for growth of the epitaxial layer between the fin and the fat spacer and cap according to another embodiment of the invention.
Figure 11:
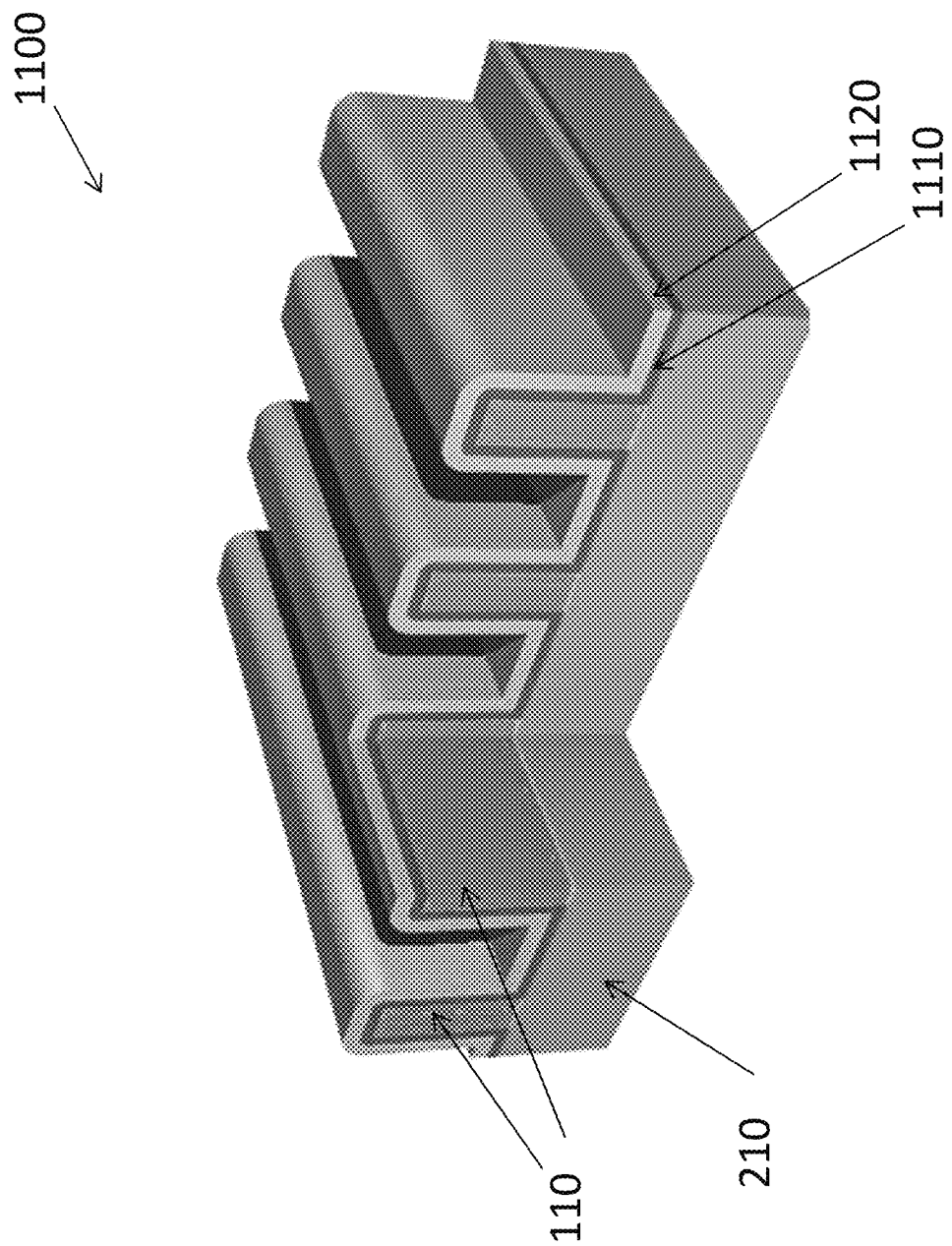
FIG. 11 shows the structure resulting from the deposition of the etch stop and spacing film on the FinFET structure shown in FIG. 4.
Figure 12:
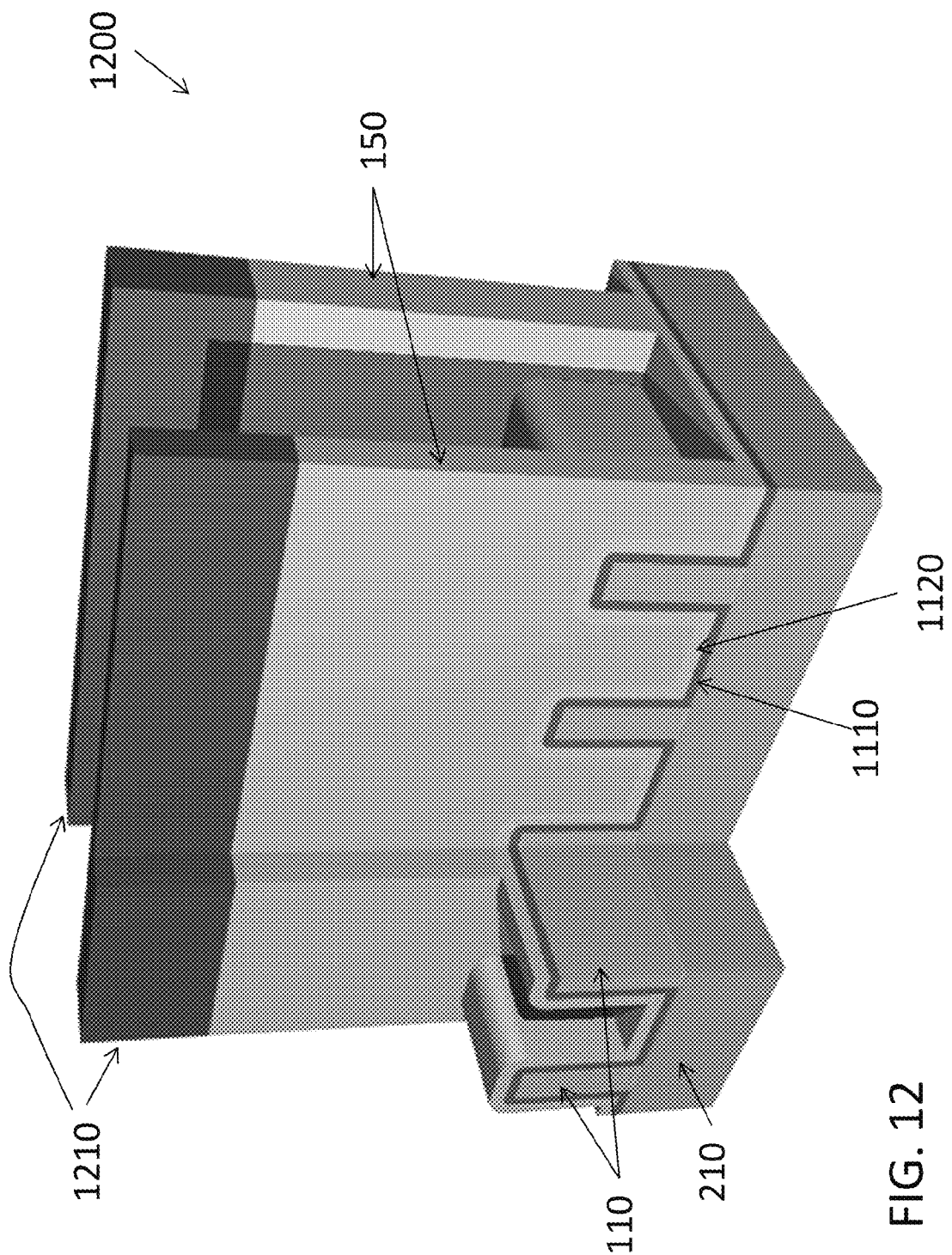
FIG. 12 illustrates the structure resulting from formation of the dummy gates lines and gate caps.

FIG. 10 is a process flow of a method of forming a void for growth of the epitaxial layer 130 between the fin 110 and the fat spacer 120 according to another embodiment of the invention. At block 1010, beginning with a fin structure 400 such as the one shown in FIG. 4 indicates that the method shown in FIG. 10 begins with the same process as the method shown in FIG. 3. At block 1020, the process shown in FIG. 10 includes depositing an etch stop 1110 (FIG. 11) and spacing film 1120 (FIG. 11). FIG. 11 shows the structure 1100 resulting from the deposition of the etch stop 1110 and spacing film 1120 on the fin structure 400 shown in FIG. 4. The etch stop 1110 many be a high K dielectric (e.g., hafnium oxide, $HfO_2$) and the spacing film 1120 may be an oxide such as silicon dioxide ($SiO_2$), for example. Exemplary thicknesses for the bi-layer oxide may be 2.5 and 3.5 nano meters (nm). At block 1030, the process shown in FIG. 10 includes forming dummy gate lines 150 and gate caps 1210 (FIG. 12). FIG. 12 illustrates the structure 1200 resulting from formation of the dummy gates lines 150 and gate caps 1210. Amorphous silicon may be deposited and planarized to form the dummy gates lines 150, and silicon nitride ($Si_3N_4$) may be deposited as the gate caps 1210. Patterning the deposited films forms the dummy gates lines 150 and the gate caps 1210.

Figure 13:
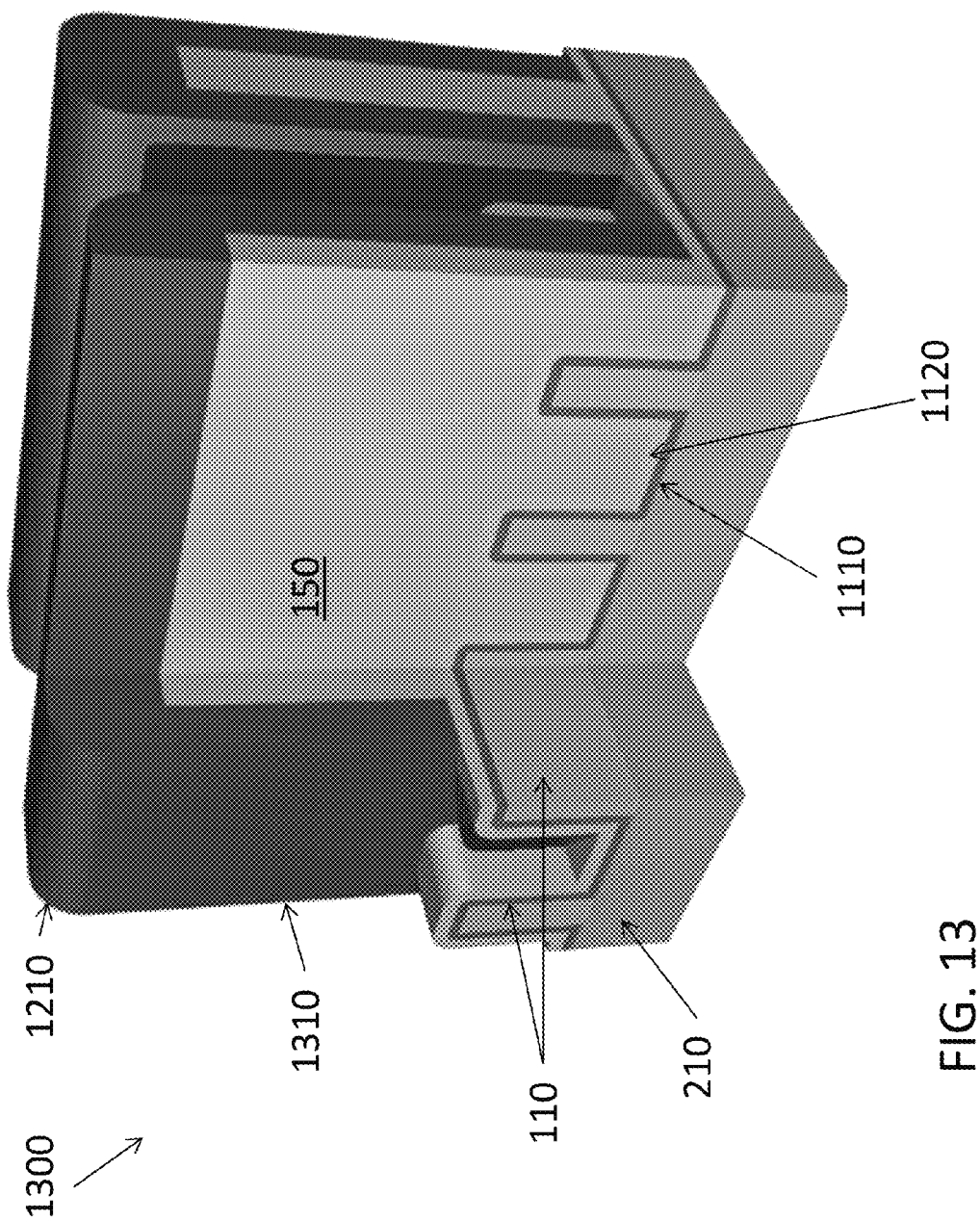
FIG. 13 shows the structure that results from forming the spacers.
Figure 14:
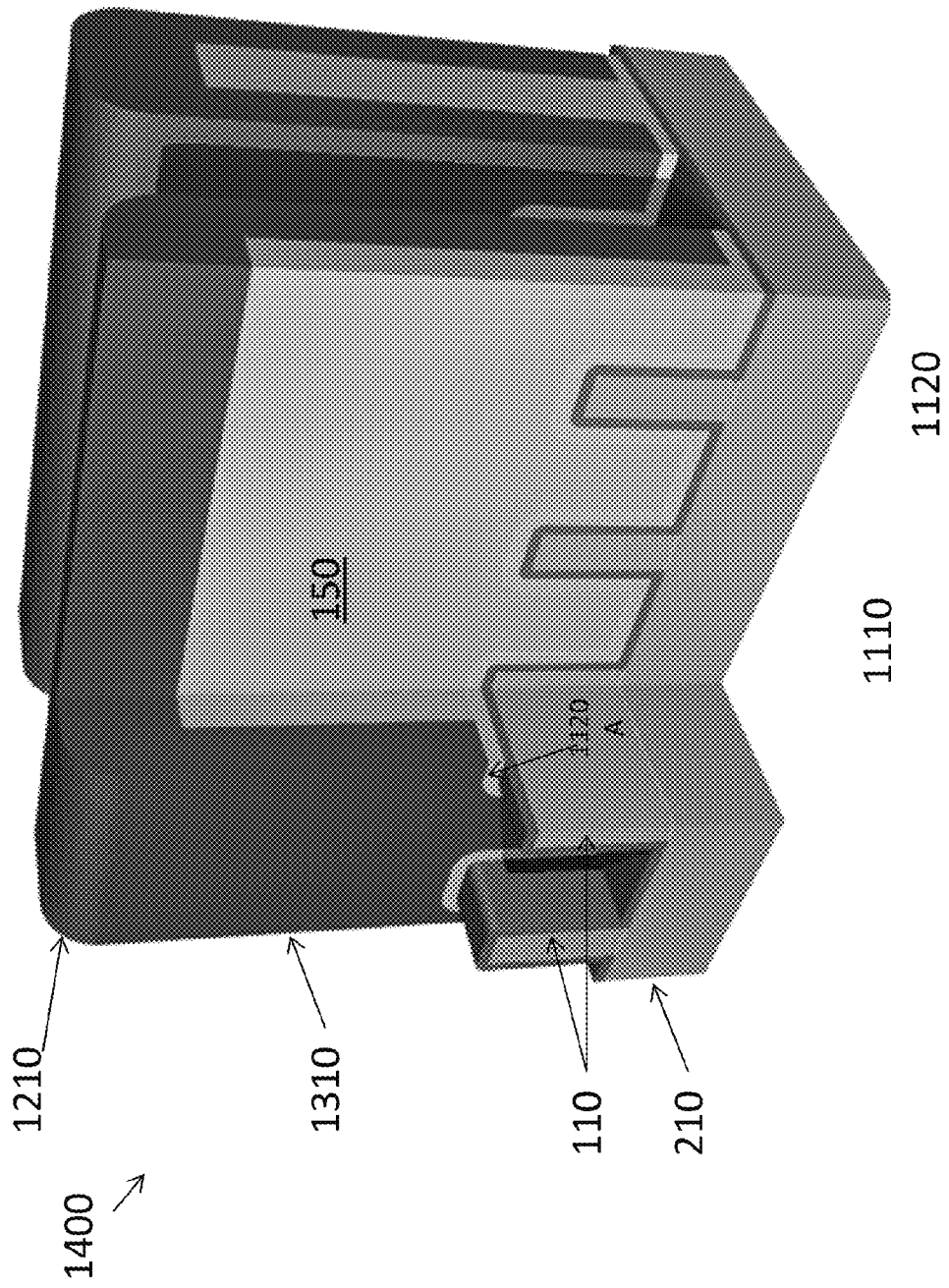
FIG. 14 shows the structure that results from etching the spacing film.
Figure 15:
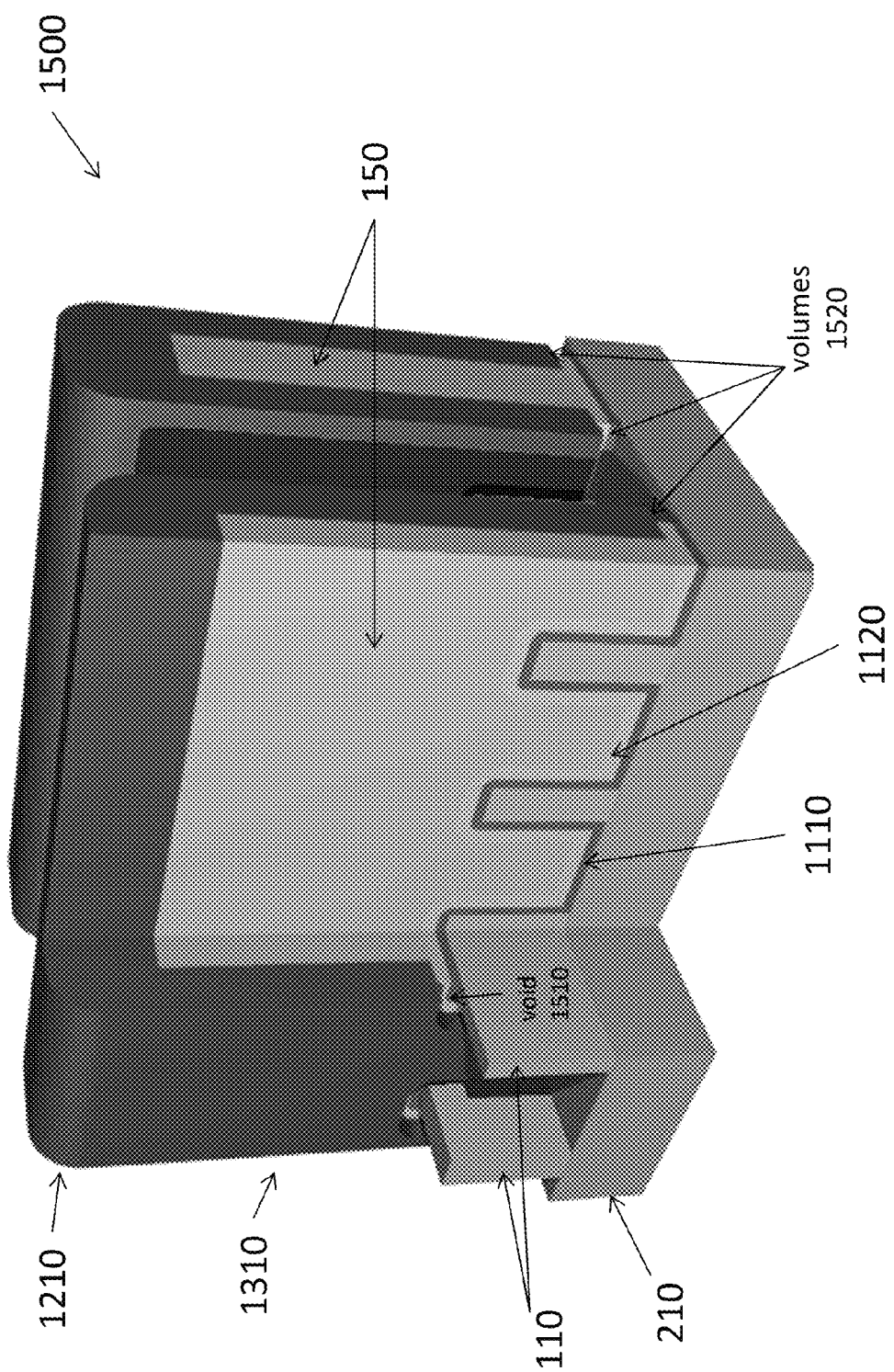
FIG. 15 depicts the structure including the void according to the embodiment described by the method shown in FIG. 10.

At block 1040, the process shown in FIG. 10 includes forming spacers 1310 (FIG. 13). This includes depositing silicon nitride ($Si_3N_4$) and performing RIE. The process also includes annealing the spacers 1310 or using high-temperatures films to control hydrofluoric acid (HF) etch rate. FIG. 13 shows the structure 1300 that results from forming the spacers 1310. At block 1050 of the method shown in FIG. 10, the process includes etching the spacing film 1120 exposes the etch stop 1110. FIG. 14 shows the structure 1400 that results from etching the spacing film 1120. An RIE process may be used to etch the spacing film 1120, stopping on the etch stop layer 1110 which may be comprised of $HfO_2$. It is important to note that the etching process (block 1050) does not remove the spacing film 1120 from the area marked "A" under the spacer 1310. At block 1060, the process shown in FIG. 10 includes pulling back the spacing film 1120 to a specified depth (distance in the same plane as 122 and 124 shown in FIG. 1) and etching the etch stop 1110 to create the void 1510 (FIG. 15). FIG. 15 depicts the structure 1500 including the void 1510 according to the embodiment described by the method shown in FIG. 10. Creating the void 1510 includes isotropically pulling back the spacing film 1120 using HF to a specified depth for the epitaxial extension (the growth of the epitaxial layer 130 under the spacer 1310) in the area marked "A" in FIG. 14. Creating the void 1510 further includes isotropically etching the etch stop layer 1110 beneath the pulled back spacing film 1120 using Carina etch, for example. Removal of the spacing film 1120 and the etch stop layer 1110 also creates the volumes 1520. Removal of etch stop layer 1110 enables growth of epitaxial layers on exposed portions of the fins 110.

The structures 900 and 1500 including respective voids 910 and 1510 are fabricated by the processes shown in FIG. 3 and FIG. 10, respectively. After the epitaxial layer 130 is grown in the voids 910, 1510 to decouple reduced extension resistance from reduced (or unchanged) parasitic capacitance to produce a structure such as the device 100 shown in FIG. 2, a standard process may be used to complete fabrication of the device 100. The standard process may include replacement metal gate processing, including post metal dielectric (e.g., $SiO_2$) deposition and planarization, and other processes to form the actual gate stack for the FinFET.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just examples. There may be many variations to these diagrams or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a fin field effect transistor (FinFET) device, the method comprising:

forming a fin on a substrate, the fin including a channel region of the device;

forming a spacer and a cap over a dummy gate line separating a source and drain of the device;

growing an epitaxial layer over portions of the fin including a region between the fin and the spacer, wherein the growing the epitaxial layer includes forming the epitaxial layer between the fin and the spacer in a stepped arrangement;

controlling an extension resistance of the device based on sizing a first stepped portion within the stepped arrangement of the epitaxial layer; and controlling a parasitic capacitance of the device based on sizing a second stepped portion within the stepped arrangement of the epitaxial layer.

2. The method according to claim 1, wherein the growing the epitaxial layer is in a diamond shape over the portions of the fin.

3. The method according to claim 1, wherein the growing the epitaxial layer includes covering the fin in an extension region of the fin.

4. The method according to claim 1, wherein the growing the epitaxial layer between the fin and the spacer is within a void.

5. The method according to claim 4, further comprising creating the void by etching a dummy epitaxial layer between the fin and the spacer.

6. The method according to claim 4, further comprising creating the void by etching a spacing film and an etch stop layer between the fin and the spacer.

7. The method according to claim 1, wherein the growing the epitaxial layer includes forming the epitaxial layer from silicon germanium doped with boron.

* * * * *